United States Patent
Dimaano, Jr. et al.

(10) Patent No.: US 7,863,108 B2
(45) Date of Patent: *Jan. 4, 2011

(54) INTEGRATED CIRCUIT PACKAGING SYSTEM WITH ETCHED RING AND DIE PADDLE AND METHOD OF MANUFACTURE THEREOF

(75) Inventors: Antonio B. Dimaano, Jr., Singapore (SG); Il Kwon Shim, Singapore (SG); Sheila Rima C. Magno, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/473,239

(22) Filed: May 27, 2009

(65) Prior Publication Data

US 2009/0230529 A1 Sep. 17, 2009

Related U.S. Application Data

(63) Continuation of application No. 11/428,272, filed on Jun. 30, 2006, now Pat. No. 7,556,987.

(51) Int. Cl.
*H01L 21/00* (2006.01)
*H01L 23/495* (2006.01)
*H01R 43/16* (2006.01)
*H05K 5/02* (2006.01)

(52) U.S. Cl. .......... 438/123; 438/127; 29/874; 257/669; 257/670; 257/676; 257/692; 257/E23.031; 257/E23.043; 257/E23.045; 361/813

(58) Field of Classification Search ............ None
See application file for complete search history.

(56) References Cited

U.S. PATENT DOCUMENTS

| | | |
|---|---|---|
| 6,380,048 B1 | 4/2002 | Boon et al. |
| 6,433,424 B1 | 8/2002 | Sammon |
| 6,437,427 B1 | 8/2002 | Choi |
| 6,525,406 B1 | 2/2003 | Chung et al. |
| 6,627,977 B1 | 9/2003 | Foster |
| 6,630,373 B2 | 10/2003 | Punzalan et al. |
| 6,713,322 B2 | 3/2004 | Lee |
| 6,713,849 B2 | 3/2004 | Hasebe et al. |
| 6,825,062 B2 | 11/2004 | Yee et al. |
| 6,828,659 B2 | 12/2004 | Iwakiri |
| 6,853,059 B1 | 2/2005 | Jang |
| 6,876,069 B2 | 4/2005 | Punzalan et al. |
| 6,995,460 B1 | 2/2006 | McLellan et al. |
| 7,049,683 B1 | 5/2006 | Sirinorakul et al. |

(Continued)

FOREIGN PATENT DOCUMENTS

JP 05-243446 9/1993

(Continued)

*Primary Examiner*—Alonzo Chambliss
(74) *Attorney, Agent, or Firm*—Mikio Ishimaru

(57) ABSTRACT

A method of manufacture of an integrated circuit packaging system is provided including: forming a D-ring includes half etching a paddle, etching a ring, and etching a tie bar. The tie bar is between the paddle and the ring. The system further includes mounting an integrated circuit die on a central portion of the D-ring, connecting the integrated circuit die and the D-ring, and encapsulating the integrated circuit die and a portion of the D-ring.

15 Claims, 4 Drawing Sheets

U.S. PATENT DOCUMENTS

| | | |
|---|---|---|
| 7,230,323 B2 | 6/2007 | Lee et al. |
| 7,242,077 B2 | 7/2007 | Ma et al. |
| 7,556,987 B2 * | 7/2009 | Dimaano et al. ............ 438/123 |
| 2001/0035569 A1 | 11/2001 | Shibata |
| 2004/0061204 A1 | 4/2004 | Han et al. |
| 2004/0061205 A1 | 4/2004 | Han et al. |
| 2004/0070056 A1 | 4/2004 | Matsuzawa et al. |
| 2005/0253230 A1 | 11/2005 | Punzalan et al. |
| 2005/0263861 A1 | 12/2005 | Ahn et al. |
| 2007/0235854 A1 | 10/2007 | Camacho et al. |
| 2007/0278633 A1 | 12/2007 | Uematsu |
| 2008/0001263 A1 | 1/2008 | Dimaano et al. |

FOREIGN PATENT DOCUMENTS

| | | |
|---|---|---|
| JP | 07-058143 | 3/1995 |

* cited by examiner

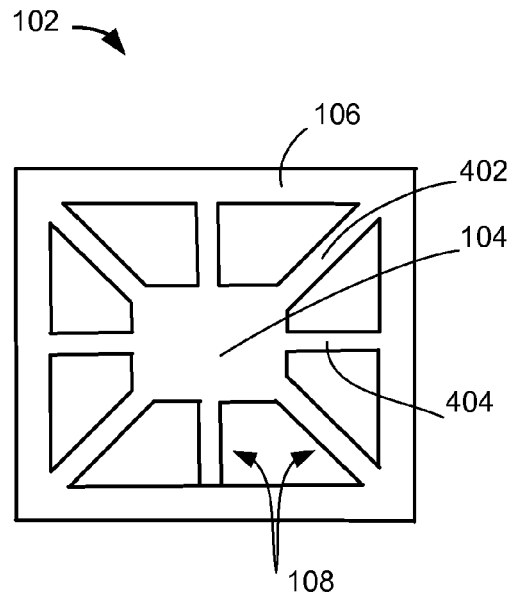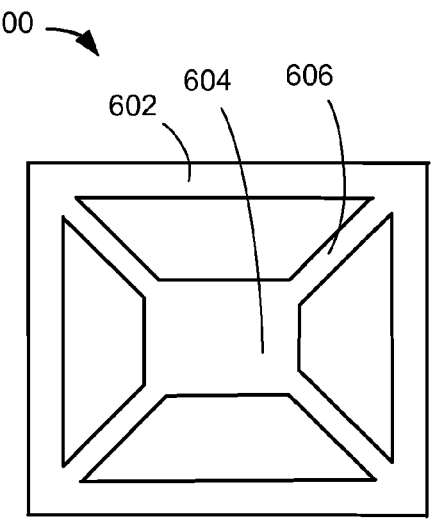
FIG. 5          FIG. 6
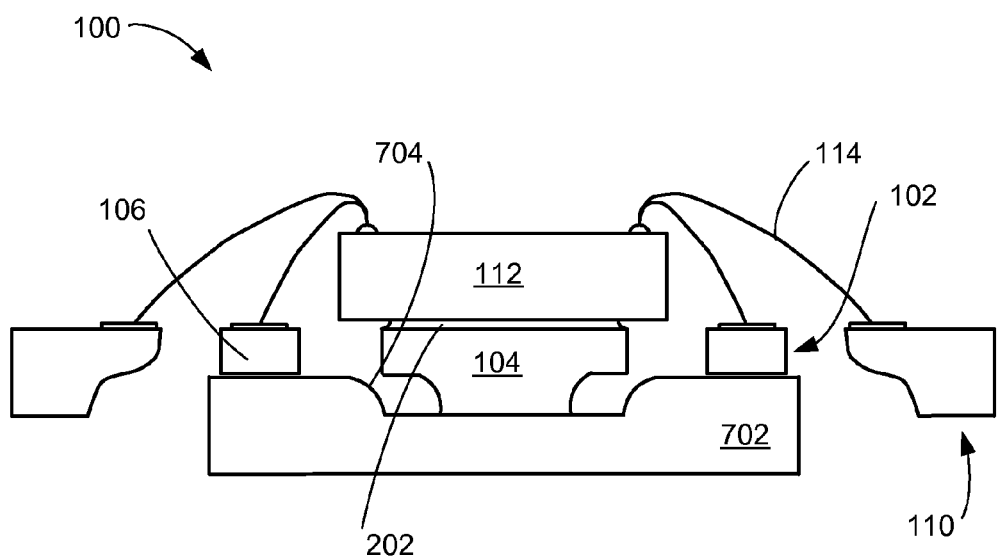
FIG. 7

INTEGRATED CIRCUIT PACKAGING SYSTEM WITH ETCHED RING AND DIE PADDLE AND METHOD OF MANUFACTURE THEREOF

CROSS-REFERENCE TO RELATED APPLICATION(S)

This is a continuation of co-pending U.S. patent application Ser. No. 11/428,272 filed Jun. 30, 2006.

TECHNICAL FIELD

The present invention relates generally to integrated circuit packages and more particularly to integrated circuit packages with a ground ring.

BACKGROUND ART

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

In the electronics industry, a continuing goal has been to reduce the size of electronic devices, such as camcorders and portable telephones, while increasing performance and speed. Integrated circuit packages for complex electronic systems typically have a large number of interconnected integrated circuit chips. The integrated circuit chips are usually made from a semiconductor material such as silicon or gallium arsenide. After manufacture, the chips are typically incorporated into packages that are then mounted on printed circuit wiring boards.

Integrated circuit chip packages typically have numerous external pins that are mechanically attached by solder or a variety of other known techniques to conductor patterns on the printed circuit wiring boards.

Typically, the packages in which these integrated circuit semiconductor chips are mounted include a substrate or other chip mounting device. One example of such a substrate is a lead frame. More particularly, a lead frame is a metal frame that includes a centrally located die paddle or die pad and a plurality of peripherally-located leads that surround the die pad. The die pad mounts the semiconductor chip (or "die"). Power, ground, and/or signal leads of the lead frame are connected electrically by wire bonds to power, ground, and/or signal sites on the chip and serve as external connecting means for the chip.

After the chip is wire-bonded to the leads, the chip, the die pad, and portions of the leads are encapsulated in a plastic, an epoxy-molded compound, or a multi-part housing made of plastic, ceramic, or metal, to form the semiconductor package. The package protects the lead frame and the chip from physical, electrical, moisture, and/or chemical damage.

Some lead frame configurations, for example exposed die pad packages, include a separate ground ring structure that is supported around the periphery of the die pad and inside the inner ends of the leads. The ground ring facilitates the many bonding wire electrical connections that typically must be made to connect ground pads on the die to electrical ground connections on the lead frame.

Typically, the ground ring is coated with a metal, such as silver, to improve bonding adhesion between the wires and the ground ring. However, silver forms a weak adhesion with the encapsulation material. This may provide problems causing separation between the integrated circuit die from the die pad.

Thus, a need still remains for an integrated circuit package system providing low cost manufacturing, improved yields, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a D-ring includes half etching a paddle, etching a ring, and etching a tie bar, the tie bar is between the paddle and the ring; mounting an integrated circuit die on a central portion of the D-ring; connecting the integrated circuit die and the D-ring; and encapsulating the integrated circuit die and a portion of the D-ring.

The present invention provides an integrated circuit package system including: a D-ring having a paddle, a ring, and a tie bar between the paddle and the ring; an integrated circuit die on a central portion of the D-ring; an interconnect between the integrated circuit die and the D-ring; and an encapsulation to cover the integrated circuit die and a portion of the D-ring.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 5 is a top view of the D-ring of FIG. 1;

FIG. 6 is a top view of a D-ring in an alternative embodiment of the present invention;

FIG. 7 is a cross-sectional view of the integrated circuit package system along a line segment 3-3 of FIG. 1 in a interconnect-attach phase.

BEST MODE FOR CARRYING OUT THE INVENTION

Figure 1:
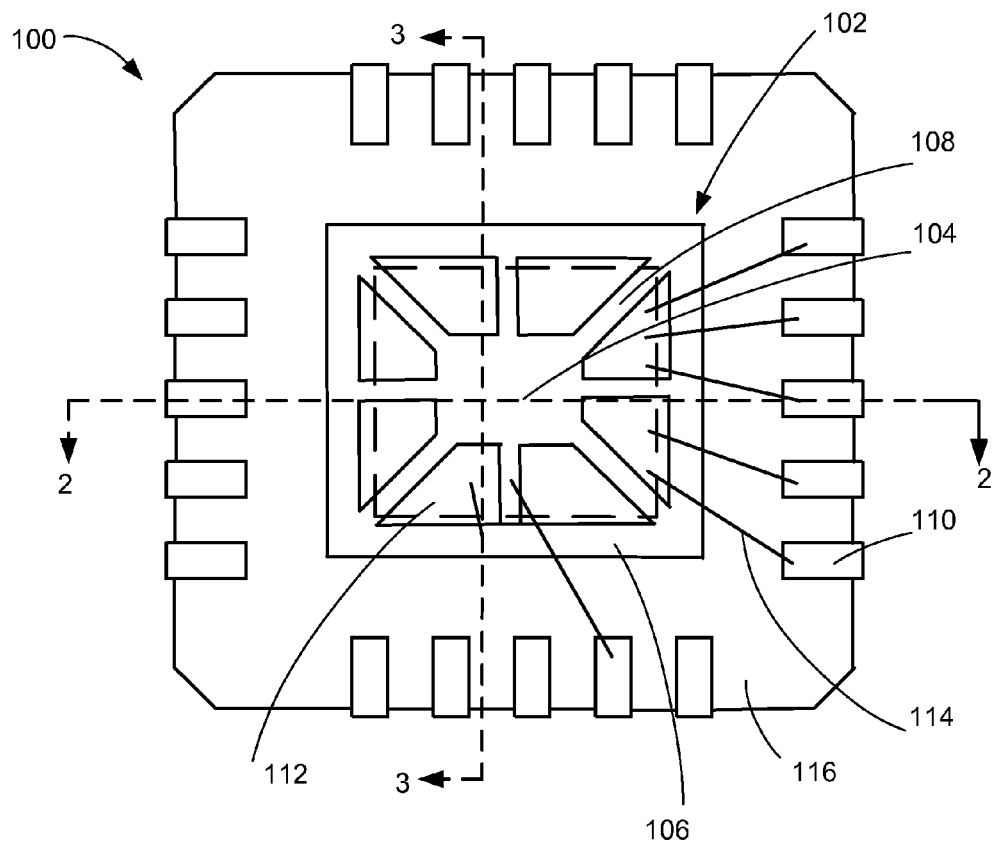
FIG. 1 is a plan view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a plan view of an integrated circuit package system 100 in an embodiment of the present invention. A D-ring 102 includes a paddle 104, such as a die paddle, a ring 106, such as a ground ring, and tie bars 108. The D-ring 102 and external interconnects 110, such as leads or lead fingers, are formed from a lead frame (not shown). The tie bars 108 connect the ring 106 at a boundary of the D-ring 102 and the paddle 104 at a central portion of the D-ring.

An integrated circuit die 112 attaches on the paddle 104 and a portion of the tie bars 108. Interconnects 114, such as bond wires, connect the integrated circuit die 112 with the external interconnects 110 or the ring 106. The interconnects 114 may also, optionally, connect to the tie bars 108. An encapsulation 116, such as an epoxy mold compound (EMC), covers the paddle 104, the ring 106, the tie bars 108, the integrated circuit die 112, and the interconnects 114. The encapsulation 116 partially covers the external interconnects 110.

The ring 106 and the tie bars 108 provide additional ground connection sites for the integrated circuit die 112 removing restrictions to connect to ground only to the external interconnects 110. The integrated circuit die 112 horizontally extends beyond the paddle 104 also attaching on the tie bars 108. This extension and attachment of the integrated circuit die 112 serve multiple functions, such as providing a mold lock and a stress relief.

The encapsulation 116 forms the mold lock by holding the integrated circuit die 112 on the paddle 104 reducing package delamination at this interface. The mold lock also improves moisture level sensitivity (MSL) test performance. Typically, the integrated circuit die 112 and the lead frame are made from materials with different coefficient of thermal expansion (CTE). The interface of the integrated circuit die 112 and the tie bars 108 also minimizes the surface contact providing the stress relief from the difference in thermal expansion further reducing the risk of package delamination.

For illustrative purpose, the external interconnects 110 are shown in a single row, although it is understood that the number of rows may differ. Also for illustrative purpose, the external interconnects 110 as shown at the boundary of the integrated circuit package system 100, although it is understood that the configuration of the external interconnects 110 may be different, such as an array or mixed array configuration.

Figure 2:
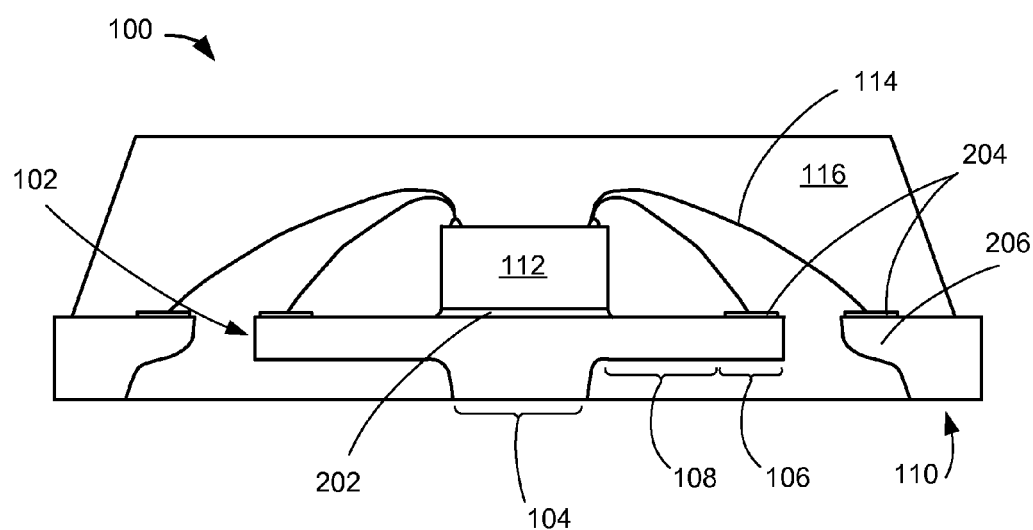
FIG. 2 is a cross-sectional view of the integrated circuit package system along a line segment 2-2 of FIG. 1.

Referring now to FIG. 2, therein is shown a cross-sectional view of the integrated circuit package system 100 along a line segment 2-2 of FIG. 1. The integrated circuit die 112 attaches on the paddle 104 and the tie bars 108 with an adhesive 202, such as a die-attach adhesive. The interconnects 114 connect the integrated circuit die 112 with a plating 204, such as silver (Ag), on the ring 106 and the external interconnects 110.

Inner portions 206 of the external interconnects 110 are half etched forming a registration for the external interconnects 110 in the encapsulation 116. The encapsulation 116 exposes portions of the external interconnects 110 for connections to the next system level (not shown), such as a printed circuit board or another device.

Portions of the D-ring 102 are half etched with other portions not etched. The ring 106 and the tie bars 108 are etched forming a registration in the encapsulation 116 as well as part of the mold lock. The paddle 104 is half etched forming a registration in the encapsulation 116 while the non-etched portion exposed to ambient. The exposed portion of the paddle 104 may serve as a heat slug, a ground connect to the next system level, or both.

Figure 3:
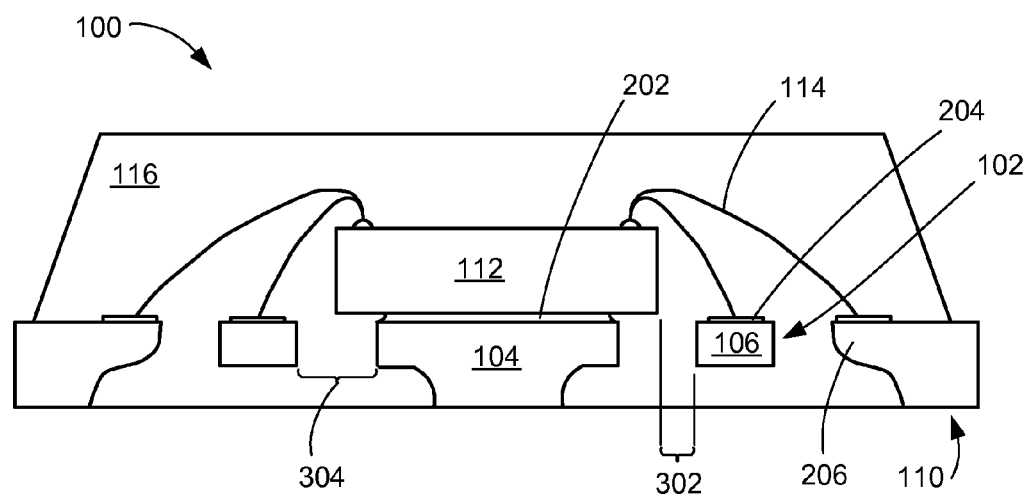
FIG. 3 is a cross-sectional view of the integrated circuit package system along a line segment 3-3 of FIG. 1.

Referring now to FIG. 3, therein is shown a cross-sectional view of the integrated circuit package system 100 along a line segment 3-3 of FIG. 1. The integrated circuit die 112 overhangs the paddle 104 with a die-ring gap 302 between the edge of the integrated circuit die 112 and the inner edge of the ring 106. Slots 304 within the D-ring 102 between the ring 106 with the paddle 104 eliminates the contamination from the adhesive 202 to the connection between the interconnects 114 and the plating 204 on the ring 106. The slots 304 also allow the adhesive 202 to overflow at the paddle 104. The resin bleed elimination allows the die-ring gap 302 to a minimum distance, such as 0.15 mm or greater than 300% improvement, accommodating larger die sizes. The interconnects 114 also attach the plating 204 on the inner portions 206, half etched, of the external interconnects 110. The encapsulation 116 covers the ring 106, the integrated circuit die 112, and the interconnects 114. The plating 204, such as silver, forms a weak adhesion with the encapsulation 116, such as EMC. The ring 106 in the encapsulation 116 provides an interlocking feature to the encapsulation 116. The external interconnects 110 and the paddle 104 are partially exposed from the encapsulation 116.

Figure 4:
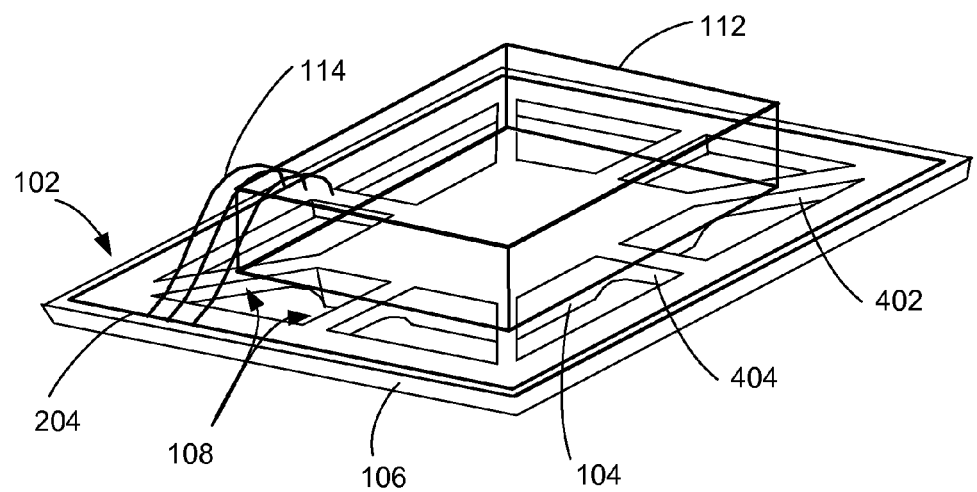
FIG. 4 is a perspective plan view of the D-ring with the integrated circuit die of FIG. 1.

Referring now to FIG. 4, therein is shown a perspective plan view of the D-ring 102 with the integrated circuit die 112 of FIG. 1. The integrated circuit die 112 is oversized compared to the paddle 104 mounting on the paddle 104 and the tie bars 108, both corner bars 402 and side bars 404. The interconnects 114 attach to the plating 204 on the ring 106.

Referring now to FIG. 5, therein is shown a top view of the D-ring 102 of FIG. 1. The D-ring 102 has an outer portion outlined by the ring 106 and a central portion occupied by the paddle 104. The tie bars 108 connect the ring 106 and the paddle 104 providing mechanical supports. The tie bars 108 include the corner bars 402 and the side bars 404. The corner bars 402 attach corners of the ring 106 and corners of the paddle 104. The side bars 404 attach sides of the ring 106 and sides of the paddle 104. The corner bars 402 and the side bars 404 provide planar rigidity for the integrated circuit package system 100 of FIG. 1 and provide multiple mold locks or registration structures.

Referring now to FIG. 6, therein is shown a top view of a D-ring 600 in an alternative embodiment of the present invention. The D-ring 600 may also be used in the integrated circuit package system 100 of FIG. 1. The D-ring 600 has an outer portion outlined by a ring 602, such as ground ring, and a central portion occupied by a paddle 604, such as a die paddle or a ground paddle. Tie bars 606 connect the ring 602 and the paddle 604 providing mechanical supports. The tie bars 606 attach corners of the ring 602 and corners of the paddle 604. The tie bars 606 provide additional planar rigidity for the integrated circuit package system 100 of FIG. 1 and provide multiple mold locks or registration structures. The D-ring 600 minimizes surface contact between the integrated circuit die 112 of FIG. 1 and the tie bars 606 providing enhanced stress relief.

Referring now to FIG. 7, therein is shown a cross-sectional view of the integrated circuit package system 100 along a line segment 3-3 of FIG. 1 in an interconnect-attach phase. The D-ring 102 is on a clamper 702, such as a wire bond clamper. The non-etched portion of the paddle 104 is on the clamper 702 in a clamp recess 704. The ring 106 is on the non-recessed portion of the clamper 702. The integrated circuit die 112 attaches on the paddle 104 with the adhesive 202. The clamper 702 has a bias during ground bonding the interconnects 114 between the integrated circuit die 112 and the ring 106. The interconnects 114 also connect the integrated circuit die 112 and the external interconnects 110.

Figure 8:
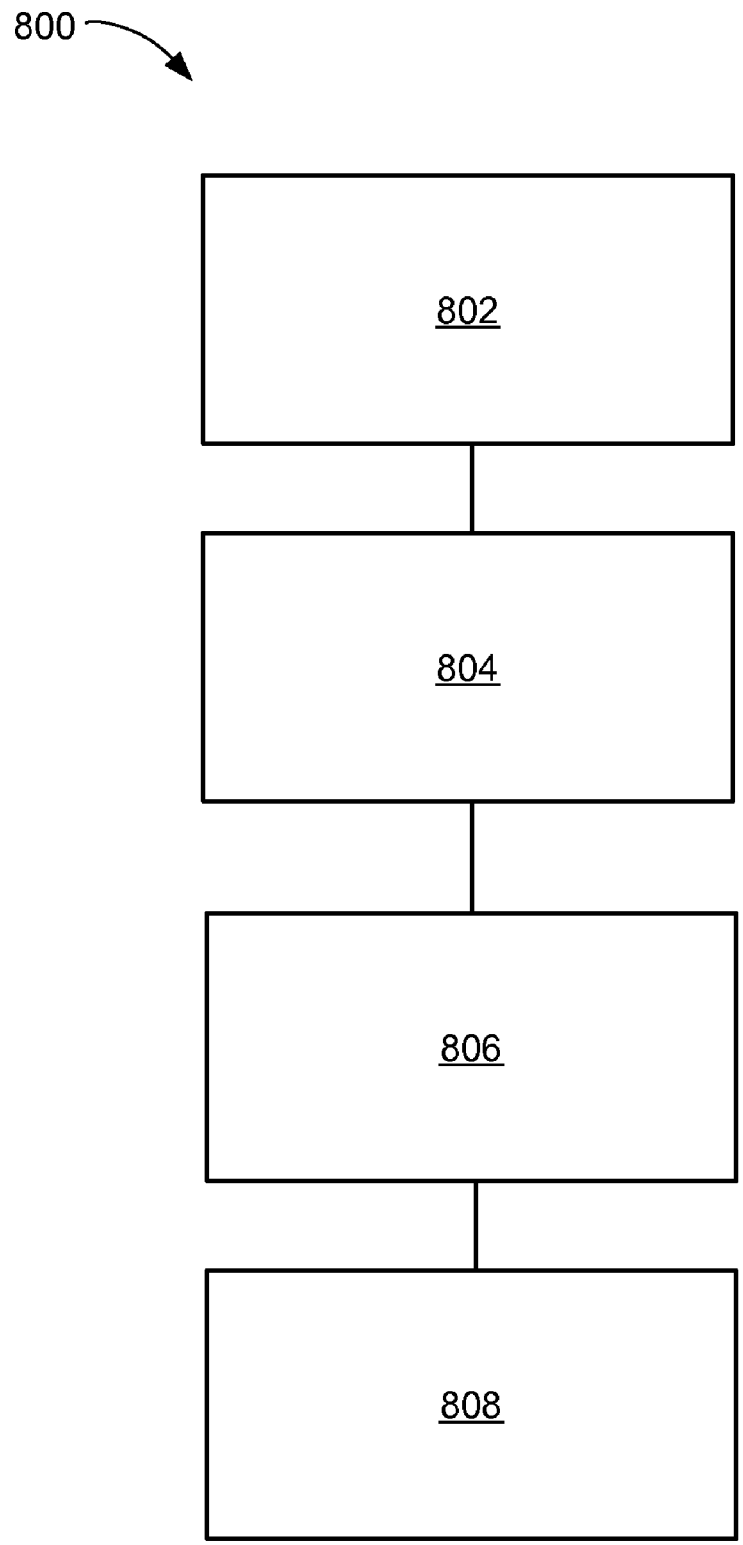
FIG. 8 is a flow chart of a method of manufacture of an integrated circuit packaging system in a further embodiment of the present invention.

Referring now to FIG. 8, therein is shown a flow chart 800 of a method of manufacture of an integrated circuit packaging system 100 in a further embodiment of the present invention. The system 800 includes forming a D-ring comprises half etching a paddle, etching a ring, and etching a tie bar, the tie bar is between the paddle and the ring in a block 802; mounting an integrated circuit die on a central portion of the D-ring in a block 804; connecting the integrated circuit die and the D-ring in a block 806; and encapsulating the integrated circuit die and a portion of the D-ring in a block 808.

It has been discovered that the present invention thus has numerous aspects.

It has been discovered that the present invention simplifies manufacturing process, improves yield, improves reliability, and reduces the overall cost with the D-ring structure in the integrated circuit package system.

An aspect is that the present invention provide a method of fabricating quad leadless package lead frame (QLP LF) with better locking mechanism with the weak adhesion of the lead frame and Ag plating while minimizing stress level of the package.

Another aspect of the present invention improves MSL test results of the integrated circuit package system which is demanded by customers for QLP.

Yet another aspect of the present invention provides lower cost because no need for baking, humidity indicators, gel pack, vacuum bag, and vacuum sealers as well as cycle time improvement.

Yet another aspect of the present invention has the QLP LF die attach paddle half etch in such a way that the die can be overhang or attached in a normal process. The non-etched portion may serve multiple functions as ground connection, heat sink, or both.

Yet another aspect of the present invention has the ground ring as fully half etch separating itself with the die attach paddle but connected through tie bars. The separation between the die attach paddle and the ground ring eliminates silver plating bleed for QLP LF.

Yet another aspect of the present invention has the ground ring as mold lock mechanism of EMC to silver plated ground ring minimizing delamination on this area.

Yet another aspect of the present invention is the tie bars may be configured minimizing stress area around die area. The configuration is flexible allowing stress relief and mold lock features with various D-ring configurations.

Thus, it has been discovered that the integrated circuit package system method of the present invention furnishes important and heretofore unknown and unavailable solutions, capabilities, and functional aspects for improving yield and reliability in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
   forming a D-ring comprises:
      half etching a paddle,
      etching a ring, and
      etching a tie bar, the tie bar is between the paddle and the ring;
   mounting an integrated circuit die on a central portion of the D-ring with the integrated circuit die extending horizontally beyond the paddle;
   connecting the integrated circuit die and the D-ring; and
   encapsulating the integrated circuit die and a portion of the D-ring.

2. The method as claimed in claim 1 wherein mounting the integrated circuit die on the central portion of the D-ring includes mounting the integrated circuit die on the paddle and the tie bar.

3. The method as claimed in claim 1 wherein encapsulating the portion of the D-ring includes encapsulating the ring and a portion of the paddle.

4. The method as claimed in claim 1 wherein forming the D-ring includes forming a side bar, a corner bar, or both between the ring and the paddle.

5. The method as claimed in claim 1 further comprising:
   half etching an external interconnect; and
   connecting the integrated circuit die and the external interconnect.

6. An integrated circuit package system comprising:
   a D-ring comprises:
      a paddle,
      a ring, and
      a tie bar between the paddle and the ring;
   an integrated circuit die on a central portion of the D-ring with the integrated circuit die extending horizontally beyond the paddle;
   an interconnect between the integrated circuit die and the D-ring; and
   an encapsulation to cover the integrated circuit die and a portion of the D-ring.

7. The system as claimed in claim 6 wherein the integrated circuit die on the central portion of the D-ring includes the integrated circuit die on the paddle and the tie bar.

8. The system as claimed in claim 6 wherein the encapsulation to cover the portion of the D-ring includes the encapsulation to cover the ring and a portion of the paddle.

9. The system as claimed in claim 6 wherein the D-ring includes a side bar, a corner bar, or both between the ring and the paddle.

10. The system as claimed in claim 6 further comprising an external interconnect electrically connected to the integrated circuit die with the interconnect.

11. The system as claimed in claim 6 wherein:
the D-ring comprises:
   the paddle in a central portion,
   the ring at a boundary, and
   the tie bar between the paddle and the ring;
the integrated circuit die on the D-ring is on the paddle and the tie bar;
the interconnect between the integrated circuit die and the D-ring is connected to the ring;
the encapsulation is a cover for the integrated circuit die, the interconnect, the ring, and a portion of the paddle; and
further comprising:
   an external interconnect connected to the integrated circuit die by the interconnect.

12. The system as claimed in claim 11 the integrated circuit die on the paddle and the tie bar includes the integrated circuit die attached with an adhesive.

13. The system as claimed in claim 11 further comprising a plating on the ring.

14. The system as claimed in claim 11 wherein the external interconnect has an inner portion etched.

15. The system as claimed in claim 11 further comprising a slot between the ring and the paddle to eliminate resin bleed on the ring from an adhesive.

* * * * *